US012645859B2

(12) United States Patent　(10) Patent No.:　US 12,645,859 B2
Agarwal　(45) Date of Patent:　Jun. 2, 2026

(54) DATAFLOW BASED GUIDANCE FOR BUFFER ALLOCATION IN MULTICORE ARCHITECTURES

(71) Applicant: Xilinx, Inc., San Jose, CA (US)

(72) Inventor: Ajit K. Agarwal, Hyderabad (IN)

(73) Assignee: Xilinx, Inc., San Jose, CA (US)

( * ) Notice: Subject to any disclaimer, the term of this patent is extended or adjusted under 35 U.S.C. 154(b) by 779 days.

(21) Appl. No.: 18/057,199

(22) Filed: Nov. 18, 2022

(65) Prior Publication Data

US 2024/0176942 A1　May 30, 2024

(51) Int. Cl.
　G06F 30/398　(2020.01)
　G06F 30/392　(2020.01)
(52) U.S. Cl.
　CPC .......... G06F 30/398 (2020.01); G06F 30/392 (2020.01)
(58) Field of Classification Search
　CPC ........ G06F 30/327; G06F 30/13; G06F 30/30; G06F 30/333; G06F 30/331; G06F 15/825; G06F 15/7867; G06F 9/3005; G06F 12/08; G06F 2119/18; G06F 9/3001; G06F 9/3016; G06F 9/30036; G06F 9/30014; G06F 9/30072; G06F 9/30189; G06F 9/3897; G06F 9/30087; G06F 9/3017; G06F 9/30181; G06F 9/542

USPC .................................................. 716/108–115
See application file for complete search history.

(56)　References Cited

U.S. PATENT DOCUMENTS

| 7,668,186 B1 | 2/2010 | Nelson, IV et al. |
| 7,707,019 B1 | 4/2010 | Ballagh et al. |
| 7,869,452 B1 | 1/2011 | Neuendorffer |
| 7,996,649 B1 | 8/2011 | Asserhall |
| 8,330,501 B1 | 12/2012 | Santurkar et al. |
| 8,752,075 B1 | 6/2014 | Lee et al. |
| 9,449,131 B2 | 9/2016 | Han et al. |
| 9,824,172 B1 | 11/2017 | Hao et al. |
| 10,331,836 B1 | 6/2019 | Hosangadi et al. |
| 11,119,921 B1 | 9/2021 | Hegde |
| 11,188,312 B2 | 11/2021 | Sastry et al. |
| 11,301,295 B1 | 4/2022 | Gupta et al. |
| 2018/0189063 A1* | 7/2018 | Fleming .............. G06F 13/4221 |
| 2019/0205284 A1* | 7/2019 | Fleming ................. G06F 9/542 |
| 2019/0303297 A1* | 10/2019 | Fleming, Jr. ........ G06F 13/1668 |

* cited by examiner

*Primary Examiner* — Binh C Tat
(74) *Attorney, Agent, or Firm* — Kevin T. Cuenot

(57)　ABSTRACT

Providing dataflow based guidance for buffer allocation in a multicore circuit architecture includes converting, using computer hardware, an application specified in a high-level programming language into an intermediate representation. Buffers of dataflows of the intermediate representation are detected. Determining whether the buffers are independent or dependent based on an analysis of the dataflows of the intermediate representation. Buffer constraints are generated. The buffer constraints specify whether the buffers are independent and dictate a mapping of the buffers in the multicore circuit architecture.

17 Claims, 5 Drawing Sheets

200

1

DATAFLOW BASED GUIDANCE FOR BUFFER ALLOCATION IN MULTICORE ARCHITECTURES

RESERVATION OF RIGHTS IN COPYRIGHTED MATERIAL

TECHNICAL FIELD

This disclosure relates to implementing designs in multicore circuit architectures and, more particularly, to allocating buffers of the design within multicore circuit architectures based on dataflows of the design.

BACKGROUND

Different types of integrated circuits (ICs) implement multicore circuit architectures suited to perform various compute operations. These compute operations may relate to packet processing, cryptography, digital signal processing, image processing, machine learning, communications, or any of a variety of other operations. In some arrangements, the IC includes a processor that has multiple cores. In other arrangements, the IC may include an array of hardware processors cores disposed in respective compute circuit blocks. In addition to hardware processors, the array may have a variety of other circuit resources including, but not limited to, memories, switches, direct memory access (DMA) engines, and the like.

A design to be implemented in a multicore circuit architecture such as an array must be compiled for execution therein. The compilation process, in addition to generating object code for execution by the hardware processors of the array, entails a variety of operations such as mapping kernels of the application to particular hardware processors of the array and routing data paths, e.g., nets, between the kernels using the other circuit resources of the array. As part of compilation, buffers must be allocated along certain data paths within the array to ensure that the design executes efficiently and avoids deadlock conditions.

SUMMARY

In one or more example implementations, a method includes converting, using computer hardware, a design specified in a high-level programming language into an intermediate representation. The design is for a multicore circuit architecture. The method includes detecting buffers of dataflows of the intermediate representation. The method includes determining whether the buffers are independent or dependent based on an analysis of the dataflows of the intermediate representation performed using the computer hardware. The method includes generating buffer constraints. The buffer constraints specify whether the buffers of the intermediate representation are independent and provide guidance for mapping the buffers in the multicore circuit architecture.

The foregoing and other implementations can each optionally include one or more of the following features, alone or in combination. Some example implementations include all the following features in combination.

In some aspects, the method includes modifying the design, as specified in the high-level programming language, to specify memory banks for the buffers based on the buffer constraints.

In some aspects, the method includes mapping the buffers to compute tiles of the multicore circuit architecture based on the buffer constraints.

In some aspects, the buffers are mapped to a same compute tile of the multicore circuit architecture in response to determining that the buffers are dependent.

In some aspects, the buffers are mapped to a same memory bank of a same compute tile of the multicore circuit architecture in response to determining that the buffers are dependent.

In some aspects, the buffers are mapped to different compute tiles of the multicore circuit architecture in response to determining that the buffers are independent.

In some aspects, the buffers are mapped to different memory banks of a same compute tile of the multicore circuit architecture in response to determining that the buffers are independent.

In one or more example implementations, a system includes one or more processors configured (e.g., programmed) to initiate operations as described within this disclosure.

In one or more example implementations, a computer program product includes one or more computer readable storage mediums having program instructions embodied therewith. The program instructions are executable by computer hardware (e.g., a hardware processor) to cause the computer hardware to initiate executable operations as described within this disclosure.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

Figure 1:
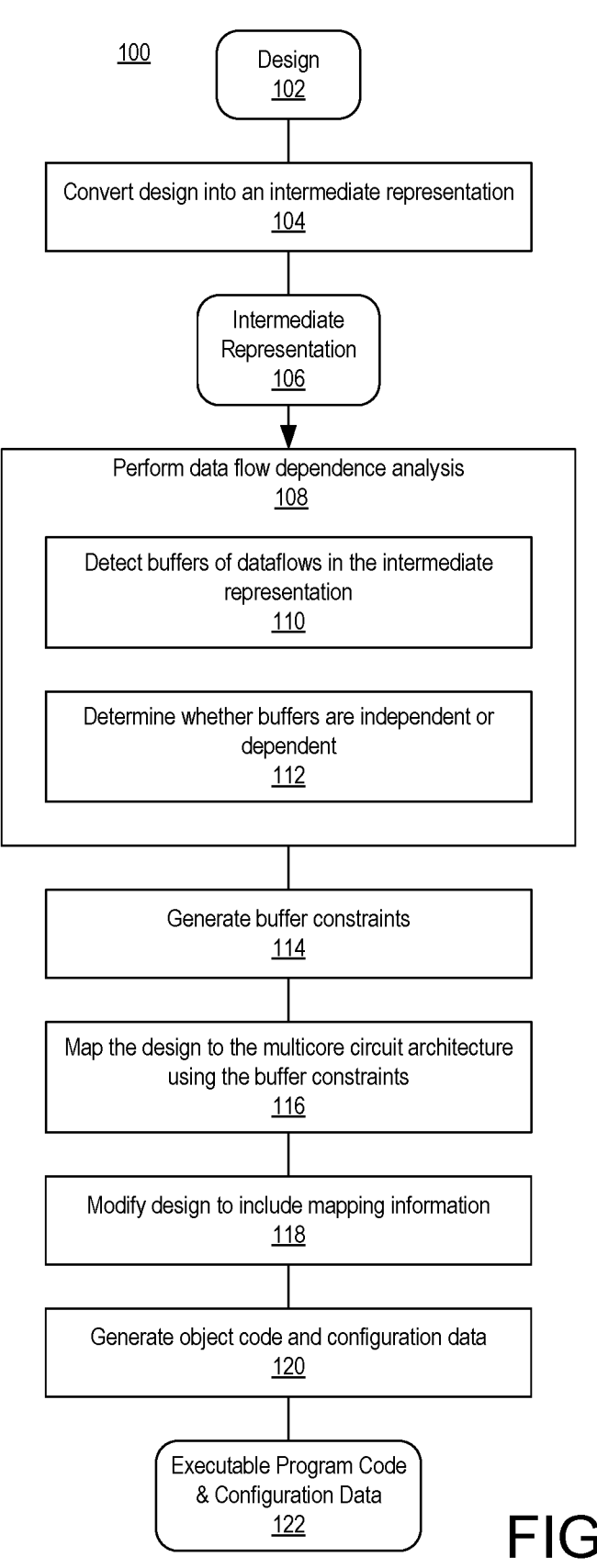
FIG. 1 illustrates an example method of processing a design for implementation in a multicore circuit architecture.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to implementing designs in multicore circuit architectures and, more particularly, to allocating buffers of the design within multicore circuit architectures based on dataflows of the design. An example of a multicore circuit architecture is a data processing array. A data processing array includes a plurality of compute circuit blocks called compute tiles that are implemented as hardened and programmable circuit blocks. Each compute tile may include a hardware processor, also referred to herein as a "core," and a memory. Each hardware processor is capable of executing program code. Buffers are allocated, or mapped, to the memories of the compute tiles.

A design developed to execute on a multicore circuit architecture includes one or more functions referred to as "kernels." The kernels, for example, may be user-specified (e.g., custom) or obtained from a library of pre-defined kernels. The kernels, whether from a library or user-specified, may implement any of a variety of functions, including commonly used functions. These functions may be specific to a particular domain such as image processing, communications (e.g., radio-frequency communications), cryptography, machine learning, or the like. In one aspect, the design may be specified as a data flow graph (DFG) including a plurality of nodes representing the kernels where the nodes are connected by edges representing the data paths between the kernels.

To implement the design on the multicore circuit architectures, the design is compiled. Compilation includes a variety of operations such as, for example, mapping the kernels to different cores of the multicore circuit architecture for execution, allocating buffers for the various dataflows to ensure efficient execution of the design on the target hardware, and routing data paths of the design that connect the kernels as mapped. Compilation also includes generating object code corresponding to the kernels that may be executed by the cores to which the kernels have been mapped and generating configuration data that implements the buffer allocation and routes.

In accordance with the inventive arrangements described within this disclosure, methods, systems, and computer program products are provided that are capable of generating guidance for mapping buffers to memories of a multicore circuit architecture. A design may be compiled for implementation in a multicore circuit architecture. During the compilation process, dataflows of the design involving buffers are analyzed to determine buffer dependency data. That is, the buffers are analyzed to determine which buffers are dependent on one another and which buffers are independent of one another.

The buffer dependency data determined from the dataflow analysis is used to generate buffer constraints. The buffer constraints are used in further compilation operations to map, or allocate, the buffers to locations, e.g., different cores or compute tiles, within the multicore circuit architecture.

Within this disclosure, mapping or allocating a buffer to a particular core means that the buffer has been mapped or allocated (e.g., assigned) to the memory located within the same compute tile as the referenced core. As an illustrative and non-limiting example, the buffer constraints provide guidance that may be used by a mapper that is configured to assign buffers to particular memories having designated locations in the multicore circuit architecture.

The buffer constraints that are generated, when utilized to map buffers of the design to memories of the target hardware, avoid creating scenarios that require inter-core communication. By allocating buffers in a manner that conforms with the buffer constraints, the design, as implemented in the target hardware, reduces the amount of inter-core communication required, which avoids creating race conditions between such cores. Further, by recognizing independent buffers, the opportunities for parallelism and, as such, faster execution of the design as implemented in the target hardware at runtime, may be increased.

Further aspects of the inventive arrangements are described below with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates an example method 100 of processing a design for implementation in a multicore circuit architecture. The operations described in connection with FIG. 1 may be performed by a data processing system executing suitable program code. For example, the data processing system may execute a compiler that is capable of generating an executable version of a design for the multicore circuit architecture. The compiler may be included in an Electronic Design Automation (EDA) tool that is executed by the data processing system. An example of a multicore circuit architecture capable of executing the compiled design is a data processing array described herein in connection with FIG. 2. An example of a data processing system that is capable of performing the operations described within this disclosure (e.g., FIG. 1) is described in connection with FIG. 5.

Referring to FIG. 1, the data processing system (system), as configured or programmed, receives a design 102 as an input. Design 102 may be specified as an application using source code. The source code is a collection of computer instructions written using a human-readable computer language such as text. Different computer languages may be expressed as source code. In one or more examples, design 102 is specified in a high-level programming language such as C/C++, Python, or other similar programming language. In one or more example implementations, design 102, being specified in source code, may specify a data flow graph that is compiled by the system.

In block 104, the system is capable of converting design 102 into an intermediate representation 106. That is, the system generates intermediate representation 106 from design 102. As defined within this disclosure, the term "intermediate representation" is the code, specified as a data structure, used internally by a compiler or a virtual machine to represent source code. A compiler translates high-level programming language source code into an intermediate representation to perform further operations on the source code. An intermediate representation is designed to be conducive to further processing, such as optimization of source code and further translation of the source code into an executable or a hardware implementation.

An intermediate representation is an accurate representation of the source code that is capable of representing the source code without loss of information and is independent of any particular source or target language. Within this disclosure, intermediate representation 106 may use a static single assignment (SSA) compliant form. Examples of intermediate representations include, but are not limited to, stack machine code, two address code, three address code, and/or a graph data structure. Other examples of intermediate representations may include, but are not limited to, Low Level Virtual Machine (LLVM) intermediate representation and GNU Compiler Collection (GCC) intermediate representation.

In block 108, the system performs a data flow dependence analysis on intermediate representation 106. A data flow dependence analysis is a code optimization technique that is capable of detecting data dependencies in data used by an application such as design 102. In block 108, the system determines data dependencies from intermediate representation 106. The dependencies may be expressed as buffer dependency data. Data dependence refers to a situation where a program statement (e.g., instruction) refers to data of a preceding program statement. In performing data flow analysis, the compiler collects information about design 102, as expressed in intermediate representation 106.

Intermediate representation 106 includes representations of the various kernels of design 102. The data flow analysis performed in block 108 may be performed on a per kernel basis. That is, the data flow dependence analysis of block 108 determines the data dependencies within each respective kernel of the design. As part of block 108, the system determines which arguments, for example, are passed to the kernel(s) and the particular functions passing the arguments to the kernels.

In the example, the data flow dependence analysis of block 108 may include two general phases. In block 110, the system detects the various buffers within intermediate representation 106. In block 112, the system determines whether the buffers are independent or dependent. For purposes of illustration, an example of a scenario in which buffers are dependent is where a value is loaded from main memory into a variable and subsequently stored back into main memory at a different location. The two memory locations, e.g., the initial memory location from which the value was read and the final memory location to which the value was written, are said to be dependent on each other.

In the example, as part of block 112, the system is capable of determining several different types of buffer dependencies from intermediate representation 106. Detection of any one of the dependences among two or more buffers indicates that the buffers are dependent upon one another. In discussing different types of buffer dependencies, the following discussion is helpful. In general, a load operation copies data from main memory into a register (e.g., a variable). A store operation copies data from a register (e.g., a variable) into main memory.

One type of buffer dependence is a "store-store" dependency. An example of a store-store dependency is shown as intermediate representation code in Listing 1. In the example of Listing 1, two versions of the variable "r" are stored in memory. Thus, the two memory locations, e.g., buffers, are dependent upon one another.

| Listing 1 |
| --- |
| Store r1 Mem |
| Store r2 Mem |

Another type of buffer dependence is a "load-load" dependency. An example of a load-load dependency is shown as intermediate representation code in Listing 2. In the example of Listing 2, two versions of the variable "r" are loaded with values from memory. Thus, the two memory locations, e.g., buffers, are dependent upon one another.

| Listing 2 |
| --- |
| Load r1, Mem |
| Load r2, Mem |

Another type of buffer dependence is a "load-store" dependency. An example of a load-store dependency is shown as intermediate representation code in Listing 3. In the example of Listing 3, the variable "ri" is loaded from main memory and subsequently stored in main memory. Thus, the two buffers are dependent upon one another.

| Listing 3 |
| --- |
| Load ri, Mem |
| Store ri, Mem. |

Different types of buffer dependencies include memory dependence, store dependence, and load dependence. These can be summarized as follows:

A memory dependency refers to two operations that access different or same memory locations, where the memory locations are dependent.

A store dependency means there is a dependency between a store operation that copies data from a register into main memory and a load operation that copies data from main memory (e.g., the location referenced in the store operation) into a register.

A load dependency means there is a dependency between a load operation that copies data from main memory into a register and a store operation that that copies data from a register (e.g., data derived from the register referenced by the load operation) into main memory.

In one or more example implementations, the system obtains port information from design 102. The port information specifies an association of ports of the target hardware (e.g., the multicore circuit architecture) and buffers (e.g., arguments) as allocated by the "main" function of the kernel to be executed by a core. The system, for example, as part of block 112, is capable of mapping ports and arguments to the actual buffer that was allocated to that kernel.

The buffer dependency data generated in block 108 is used to indicate whether buffers should be allocated to the same core (e.g., to a same compute tile including the core) or to different cores (e.g., to different compute tiles). In addition, the buffer dependency data of block 108 may be used to indicate whether buffers should be allocated to a same memory bank of a compute tile or to different memory banks. In the case where two buffers are independent, such buffers may be mapped to different cores and/or to different memory banks since there will be no inter-core communication for independent buffers. This promotes atomicity in cases where multiple instances of a kernel may be implemented and facilitates parallel execution by the processes (e.g., kernels) that utilize each independent buffer. The independence of the buffers and mapping of the buffers in accordance with the buffer constraints supports runtime parallelism that results in faster execution of the design by the target hardware.

For example, those buffers that are independent can be mapped to different banks and/or different cores in cases where multiple instances of a same kernel are mapped to different cores. In this scenario, the compute tiles include locks that regulate access to these buffers. This means that multiple kernels (e.g., multiple instances of a same kernel) may use a same buffer. That is, the buffer, if independent, need not be replicated to the memory of each core. Rather, the buffer may be placed in a different memory bank and/or core so that one or more other instances of the kernel in other compute tiles may also access that buffer.

In the case where two buffers are dependent, such buffers may be mapped to the same core and to the same memory bank of the core. By mapping dependent buffers to the same core and same memory bank for the core, the need for inter-core communication is avoided. This avoids potential race conditions between cores. If two dependent buffers were placed into different memories (e.g., different memory banks and/or different cores), a situation is created that requires inter-communication between cores that may degrade the runtime performance of design 102.

In block 114, based on the buffer dependency data generated by the data flow dependence analysis of block 108, the system generates buffer constraints. The buffer constraints may be specified in a computer-readable and also in a human readable format. The buffer constraints, in general, specify whether buffers detected in intermediate representation 106 are independent or dependent. As an illustrative and non-limiting example, the buffer constraints may be specified using JavaScript Object Notation (JSON) or another suitable format.

In block 116, the system maps the design to the multicore circuit architecture using the buffer constraints generated in block 114. A mapper, which may be included in the compiler and/or the EDA tool, is capable of mapping, or allocating, buffers to particular memories in the multicore circuit architecture based on the buffer constraints. That is, for those buffers that are specified as independent, the mapper ensures that the buffers are allocated to different cores and/or to different memory banks of compute tiles. For those buffers that are specified as dependent, the mapper ensures that the buffers are allocated to same cores and/or to same memory banks of compute tiles.

In the example of FIG. 1, the buffer constraints do not specify a particular location for the buffers. Rather, the buffer constraints, by indicating whether the buffer(s) are dependent or independent, provide guidance to the mapper to follow. The mapper may utilize other techniques and/or algorithms that allocate the buffers to particular memories in the multicore circuit architecture that conform with (e.g., do not violate) the buffer constraints received.

In block 118, the system optionally modifies design 102 to include the mapping information determined by the mapper. In block 120, the system is capable of generating object code and configuration data. The object code may be specified as one or more binary file(s) each representing executable program code that is executable by a particular one of the cores of the multicore circuit architecture. The configuration data may specify settings for components within the multicore circuit architecture that create the connectivity, or routes, and implement the buffer allocation among the various cores. Executable program code and the configuration data 122 may be output from the system. It should be appreciated that executable program code and configuration data 122 implements a mapping of the kernels, data flows among the kernels, and a buffer allocation that is compliant with the buffer constraints generated. Executable program code and configuration data 122 can be loaded into the appropriate memories and/or configuration registers of target hardware such as a multicore circuit architecture to implement and execute design 102 therein.

Listing 4 is an example of buffer constraints that may be generated and output in block 114 of FIG. 1. In the example, the buffer constraints are specified using JSON. The example of Listing 4 indicates that "input_window_i3_pi1" and "input_window_i3_pi0" are dependent. In one or more example implementations, the buffer constraints, as generated, need only specify those buffers that are dependent.

---

Listing 4

```
"DependenceAnalysisHints": [
  {
    "FunctionName": "main",
    "Var1": "input_window_i3_pi1",
    "Var2": "input_window_i3_pi0"
  }
```

---

Listing 5 is an example of intermediate representation of source code of a design for a multicore circuit architecture.

---

Listing 5

```
%77 = load %struct.output_window.15*, %struct.output_window.15**
%output_window_i10_po0, align 4, !dbg !664, !tbaa !483, !noalias !465
  %ptr45 = getelementptr inbounds %struct.output_window.15,
%struct.output_window.15* %77, i32 0, i32 2, !dbg !665
  store i8* %76, i8** %ptr45, align 4, !dbg !666, !tbaa !656, !noalias !465
  %85 = load %struct.output_window.15*, %struct.output_window.15**
%output_window_i8_po1, align 4, !dbg !560, !tbaa !363, !noalias !345 Memory
Dependent on
  store i8* %76, i8** %ptr45, align 4, !dbg !546, !tbaa !536, !noalias
```

---

Listing 6 illustrates an example of dependency data for the intermediate representation of Listing 5. In the example of Listing 6, the buffer is memory dependent and may be load-store, store-load, or store-store type of buffer dependence.

---
Listing 6
---

```
!345
    Memory Dependent On.
        %77 = load %struct.output_window.15*,
%struct.output_window.15**%output_window_i10_po0, align 4, !dbg !544, !tbaa !363,
!noalias !345
struct.output_window.15sUI struct.output_window.15
output_window_i8_po1 isMemoryDependent on output_window_i10_po0
```

---

Listing 7 illustrates example source code for a kernel of design 102.

---
Listing 7
---

```
typedef v8cint16 chess_storage(DM_bankA) *lutA_type;
typedef v8cint16 chess_storage(DM_bankB) *lutB_type;
v8cint16 chess_storage(wr1) l1 = null_v8cint16( ); if (conf.lutMask & 0x2) l1 =
*(lutA_type)byte_incr(vars.lut1,idxL1); else l1 = null_v8cint16( );
v8cint16 chess_storage(wr0) l0 = null_v8cint16( ); if (conf.lutMask & 0x1) l0 =
*(lutA_type)byte_incr(vars.lut0,idxL0); else l0 = null_v8cint16( );
v8cint16 chess_storage(wr3) l3 = null_v8cint16( ); if (conf.lutMask & 0x8) l3 =
*(lutB_type)byte_incr(vars.lut3,idxL3); else l3 = null_v8cint16( );
v8cint16 chess_storage(wr2) l2 = null_v8cint16( ); if (conf.lutMask & 0x4) l2 =
*(lutB_type)byte_incr(vars.lut2,idxL2); else l2 = null_v8cint16( ); Fig(3)
```

---

Listing 8 illustrates an example of the intermediate representation of the source code of Listing 7.

---
Listing 8
---

```
%26 = load %struct.v8cint16, %struct.v8cint16 addrspace(5)* %25, align 32, !dbg
!656, !tbaa !639,
!noalias !598 Memory Dependent %call9 = call addrspace(1) %struct.v4cint16*
@_Z9byte_incrlK8v4cint16EPT_S3_i(%struct.v4cint16* %23, i32 %24) #26, !dbg !655,
!noalias
!598reverse %24 = load i32, i32* %idxL0.addr, align 4, !dbg !654, !tbaa !609, !noalias
!598
store %struct.v8cint16 %26, %struct.v8cint16* %l0, align 32, !dbg !656, !tbaa !639,
!noalias !598
Memory Dependent On %26 = load %struct.v8cint16, %struct.v8cint16
addrspace(5)* %25, align 32, !dbg !656, !tbaa !639, !noalias !598
```

---

The example of Listing 9 illustrates buffer dependency data for Listing 8. As shown in Listing 9, In the example of Listing 8, l0 is memory dependent on idxL0.addr. The intermediate representation of the kernel source code of Listing 7 is shown below in Listing 8.

---
Listing 9
---

```
l1 isMemoryDependent On idxL1.addr
l0 isMemoryDependent On idxL0.addr
```

-continued

---
Listing 9
---

```
l3 isMemoryDependent On idxL3.addr
l2 isMemoryDependent On idxL2.addr
```

---

Listing 10 illustrates example source code for another kernel of a design.

---
Listing 10
---

```
void fir_63t_sym(
        input_window_cint16 * restrict cb_input1,
        output_window_cint16 * restrict cb_output)
{
    input_window_cint16 chess_storage * restrict cb_input = (input_window_cint16
chess_storage * restrict )cb_input1;
    const unsigned samples = GET_NUM_SAMPLES(cb_output);
    const int shift = FIR63_SHIFT;
    v16cint16 lbuff = undef_v16cint16( ); //left side buffer for input samples
    v16cint16 rbuff = undef_v16cint16( ); //right side buffer for input samples
    input_window_cint16 temp_w;
```

-continued

---
Listing 10
---

```
  input_window_cint16 chess_storage * restrict cb_sym = (input_window_cint16
chess_storage *)&temp_w;
    v8cint16 vdata;
    const v16int16 chess_storage * restrict coeff_ = (v16int16
chess_storage*)coeffs_fir63;
```

---

Listing 11 illustrates example buffer constraints generated by the system in processing the example source code of Listing 10. In the example of Listing 11, the buffer constraints, which are expressed using JSON, indicate that the variables cb_input and cb_sym are dependent. Similarly, the variables ceo0 and cb_sym are dependent.

---
Listing 11
---

```
  "DependenceAnalysisHints": [
  {
    "FunctionName": "fir_63t_sym(input_window<cint16>*,
output_window<cint16>*)",
    "Var1": "cb_input",
    "Var2": "cb_sym"
  },
```

---

-continued

---
Listing 11
---

```
  {
    "FunctionName": "fir_63t_sym(input_window<cint16>*,
output_window<cint16>*)",
    "Var1": "coe0",
    "Var2": "cb_sym"
  },
}
```

---

Listing 12 illustrates the source code of Listing 10 as modified by the compiler based on mapper results obtained using the buffer constraints of Listing 11. In the example, particular memory banks for storing data, indicated as "DM_bankA" within parenthetical expressions, have been inserted into the source code by the system to indicate where particular buffers are to be stored. In this example, the mapper has allocated buffers, being dependent, to a same memory bank.

---
Listing 12
---

```
void fir_63t_sym(
    input_window_cint16 * restrict cb_input1,
    output_window_cint16 * restrict cb_output)
{
    input_window_cint16 chess_storage(DM_bankA) * restrict cb_input =
(input_window_cint16 chess_storage(DM_bankA) * restrict )cb_input1;
    const unsigned samples = GET_NUM_SAMPLES(cb_output);
    const int shift = FIR63_SHIFT;
    v16cint16 lbuff = undef_v16cint16( ); //left side buffer for input samples
    v16cint16 rbuff = undef_v16cint16( ); //right side buffer for input samples
    input_window_cint16 temp_w;
    input_window_cint16 chess_storage(DM_bankA) * restrict cb_sym =
(input_window_cint16 chess_storage(DM_bankA) *)&temp_w;
    v8cint16 vdata;
    const v16int16 chess_storage(DM_bankA) * restrict coeff_ = (v16int16
chess_storage(DM_bankA) *)coeffs_fir63;
```

---

By incorporating the buffer constraints illustrated in the examples of Listings 10, 11, and 12, the runtime performance of the design is improved. For example, using the buffer guidance specified by the buffer constraints illustrated in Listing 11 resulted in an improvement in data throughput of the design as implemented in the multicore circuit architecture at runtime.

Listing 13 illustrates example source code for another kernel of a design. In the example of Listing 13, the kernel is configured to perform matrix multiplication.

---
Listing 13
---

```
matmul_64x16_16x1((input_window_i3_pi0),(input_window_i3_pi1),(output_window_i
3_po0));
void matmul_64x16_16x1(
    input_window_cint16* restrict matA1,
    input_window_cint16* restrict matB1,
    output_window_cint16* restrict matC)
```

-continued

---
Listing 13
---

```
{
   input_window_cint16 chess_storage * restrict matA = (input_window_cint16
chess_storage * restrict )matA1;
   input_window_cint16 chess_storage * restrict matB = (input_window_cint16
chess_storage * restrict )matB1;
```

---

Listing 14 illustrates example buffer constraints generated by the system in processing the example source code of Listing 13. In the example of Listing 14, the buffer constraints, which are expressed using JSON, indicate that the variables input_window_i3pi1 and input_window_i3pi0 are dependent.

---
Listing 14
---

```
"DependenceAnalysisHints": [
   {
      "FunctionName": "main",
      "Var1": "input_window_i3pi1",
      "Var2": "input_window_i3pi0"
   },
}
```

---

Listing 15 illustrates the source code of Listing 13 as modified by the compiler based on mapper results obtained using the buffer constraints of Listing 14. In the example, particular memory banks for storing data, indicated as "DM_bankA" within parenthetical expressions, have been inserted into the source code by the system to indicate where particular buffers are to be stored. In this example, the mapper has allocated buffers, being dependent, to a same memory bank.

---
Listing 15
---

```
matmul_64x16_16x1((input_window_i3_pi0),(input_window_i3_pi1),(output_window_i
3_po0));
void matmul_64x16_16x1(
   input_window_cint16* restrict matA1,
   input_window_cint16* restrict matB1,
   output_window_cint16* restrict matC)
{
   input_window_cint16 chess_storage(DM_bankA) * restrict matA =
(input_window_cint16 chess_storage(DM_bankA) * restrict )matA1;
   input_window_cint16 chess_storage(DM_bankA) * restrict matB =
(input_window_cint16 chess_storage(DM_bankA) * restrict )matB1;
```

---

By incorporating the buffer constraints illustrated in the examples of Listings 13, 14, and 15, the runtime performance of the design is improved. For example, using the buffer guidance specified by the buffer constraints illustrated in Listing 14 resulted in an improvement in runtime performance of 10 clock cycles compared to runtime results obtained without performing the dependency analysis and without providing the buffer guidance of Listing 14 to the mapper.

Figure 2:
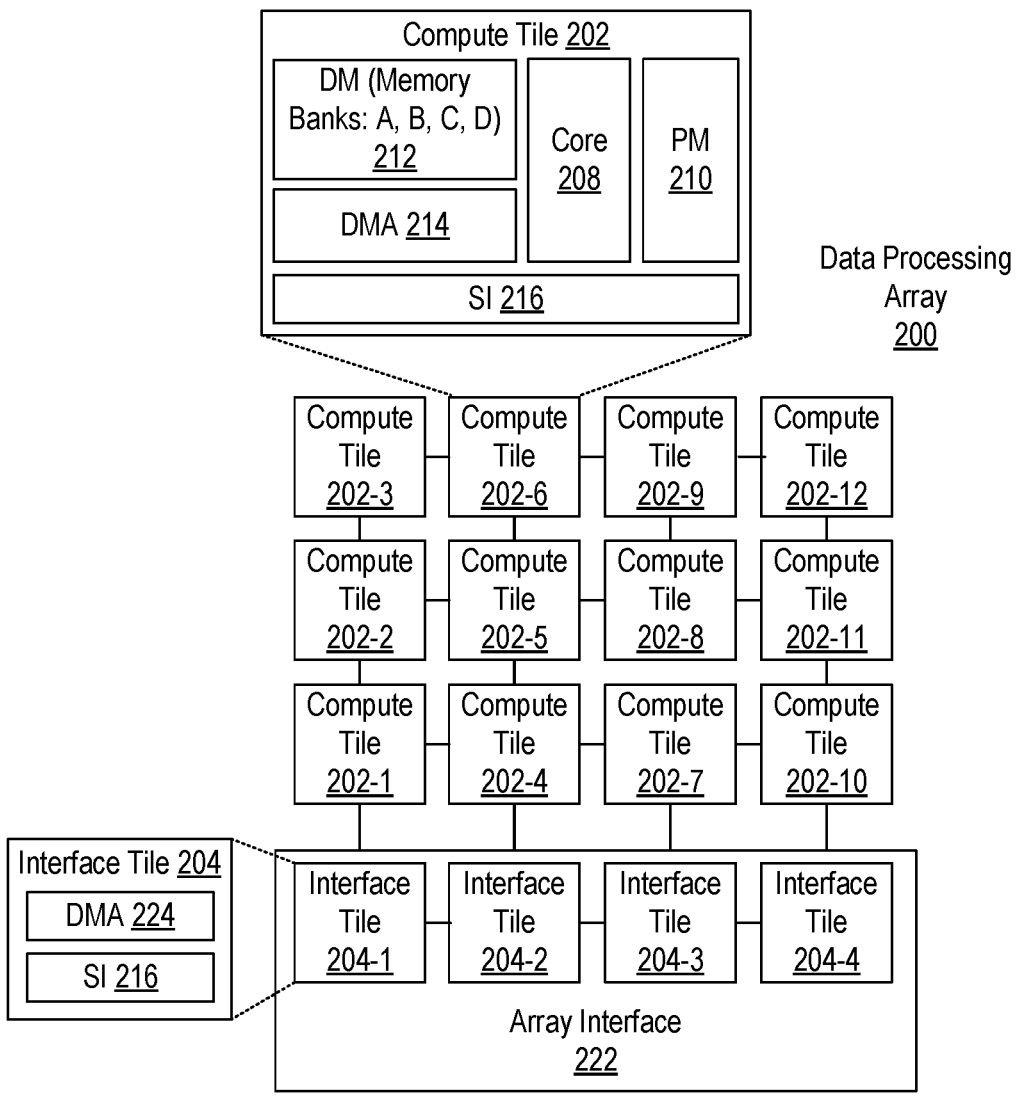
FIG. 2 illustrates an example implementation of a multicore circuit architecture.

FIG. 2 illustrates an example implementation of a data processing array 200. Data processing array 200 may be included within an IC. The IC may or may not include other systems that are communicatively linked to data processing array 200. Data processing array 200 is an example of a multicore circuit architecture and target hardware in which a design such as design 102 may be implemented and executed. Data processing array 200 may be implemented as a plurality of interconnected tiles. The term "tile," as used herein in connection with a data processing array, means a circuit block. In one or more examples, the tiles of data processing array 200 are implemented as hardwired circuit blocks. The circuit blocks may be programmable.

The interconnected tiles of data processing array 200 include compute tiles 202 (e.g., compute tiles 202-1, 202-2, 202-3, 202-4, 202-5, 202-6, 202-7, 202-8, 202-9, 202-10, 202-11, and 202-12) and interface tiles 204 (e.g., interface tiles 204-1, 204-2, 204-3, and 204-4). In an actual implementation of data processing array 200, more compute tiles 202 may be included (e.g., hundreds of such tiles). In general, each compute tile 202 is characterized by the inclusion of a core (e.g., a hardware processor) that has data processing capabilities and a local memory. The local memory can potentially be accessed by other cores in data processing array 200, subject to constraints. Data processing array 200 optionally includes one or more memory tiles (not shown). The memory tiles, if included, may be used as shared memory accessible by all cores in data processing array 200. The tiles illustrated in FIG. 2 may be arranged in an array or grid and are hardwired.

Each compute tile 202 can include one or more cores 208, a program memory (PM) 210, a data memory (DM) 212, a DMA circuit 214, and a stream interconnect (SI) 216. The data memories 212 may include multiple banks, e.g., memory banks A, B, C, and D. Data memories 212 are illustrative of the memories of the multicore architecture to which buffers are allocated or mapped. In one aspect, each core 208 is capable of executing program code stored program memory 210. In one aspect, each core 208 may be implemented as a scalar processor, as a vector processor, as a scalar processor and a vector processor operating in coordination with one another, or other processor type. In other arrangements, core 208 may be a hardwired core with dedicated functionality.

In one or more examples, each core 208 is capable of directly accessing the data memory 212 within the same compute tile 202 and the data memory 212 of any other compute tile 202 that is adjacent to the core 208 of the compute tile 202 in the up, down, left, and/or right directions. Core 208 sees data memories 212 within the same tile and in one or more other adjacent compute tiles as a unified region of memory (e.g., as a part of the local memory of the core 208). This facilitates data sharing among different compute tiles 202 in data processing array 200. In other examples, core 208 may be directly connected to data memories 212 in other compute tiles 202.

Cores 208 may be directly connected with adjacent cores 208 via core-to-core cascade connections (not shown). In one aspect, core-to-core cascade connections are unidirectional and direct connections between cores 208. In another aspect, core-to-core cascade connections are bidirectional and direct connections between cores 208. In general, core-to-core cascade connections generally allow the results stored in an accumulation register of a source core 208 to be provided directly to an input of a target or load core 208 without traversing the stream interconnect 216 (e.g., without using DMA 214) and/or being written by a first core 208 to data memory 212 to be read by a different core 208.

In an example implementation, compute tiles 202 do not include cache memories. By omitting cache memories, data processing array 200 is capable of achieving predictable, e.g., deterministic, performance. Further, significant processing overhead is avoided since maintaining coherency among cache memories located in different compute tiles 202 is not required. In a further example, cores 208 do not have input interrupts. Thus, cores 208 are capable of operating uninterrupted. Omitting input interrupts to cores 208 also allows data processing array 200 to achieve predictable, e.g., deterministic, performance.

Interface tiles 204 form an array interface 222 for data processing array 200. Array interface 222 operates as an interface that connects tiles of data processing array 200 to other resources of the particular IC in which data processing array 200 is disposed. In the example of FIG. 2, array interface 222 includes a plurality of interface tiles 204 organized in a row. Interface tiles 204 can include a stream interconnect 216 and a DMA circuit 224. Interface tiles 204 are connected so that data may be propagated from one interface tile to another bi-directionally. Each interface tile 204 is capable of operating as an interface for the column of tiles directly above and is capable of interfacing such tiles with components and/or subsystems of the IC including data processing array 200.

Figure 3:
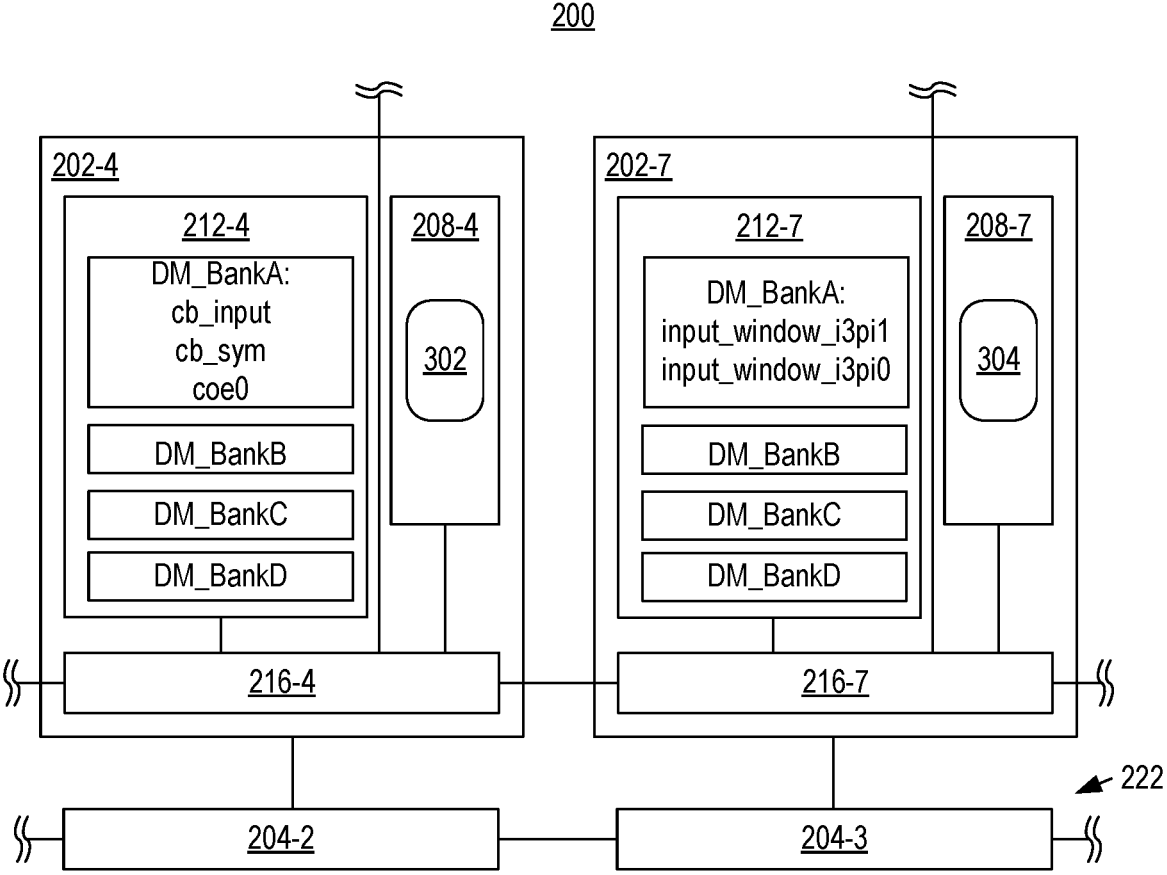
FIG. 3 illustrates a portion of a multicore circuit architecture with a portion of a design mapped thereto in accordance with generated buffer constraints.

FIG. 3 illustrates a portion of data processing array 200 with a portion of a design mapped thereto. In the example of FIG. 3, kernels corresponding to Listing 10 and Listing 13 are shown as kernels 302 and 304, respectively. As shown, kernel 302 is mapped to core 208-4 (e.g., compute tile 202-4 having core 208-4, data memory 212-4, and stream interconnect 216-4). The dependent buffers of Listing 11 have been mapped to a same core (e.g., 208-4) and to a same memory bank, e.g., DM_BankA, of memory 212-4. Kernel 304 has been mapped to core 208-7 (e.g., compute tile 202-7 having core 208-7, data memory 212-7, and stream interconnect 216-7). The dependent buffers of Listing 12 have been mapped to a same core (e.g., 208-7) and to a same memory bank, e.g., DM_BankA, of memory 212-7. Interface tiles 204-2 and 204-3 are also shown.

In the example of FIG. 3, if kernel 302 is replicated (e.g., another instance is used in the design), the buffers illustrated in FIG. 3 in DM_BankA of memory 212-4 would also be replicated in that the local memory for that core. Similarly, if kernel 304 is replicated (e.g., another instance is used in the design), the buffers illustrated in FIG. 3 in DM_BankA of memory 212-7 would also be replicated in that the local memory for that core.

By comparison, any independent buffers may be implemented one time despite there being multiple instances of the kernel executing in different cores of data processing array. Such cores would access the same physical buffer using a system of memory locks (not shown) included in the respective cores for controlling multiple core accesses to memories 212.

Figure 4:
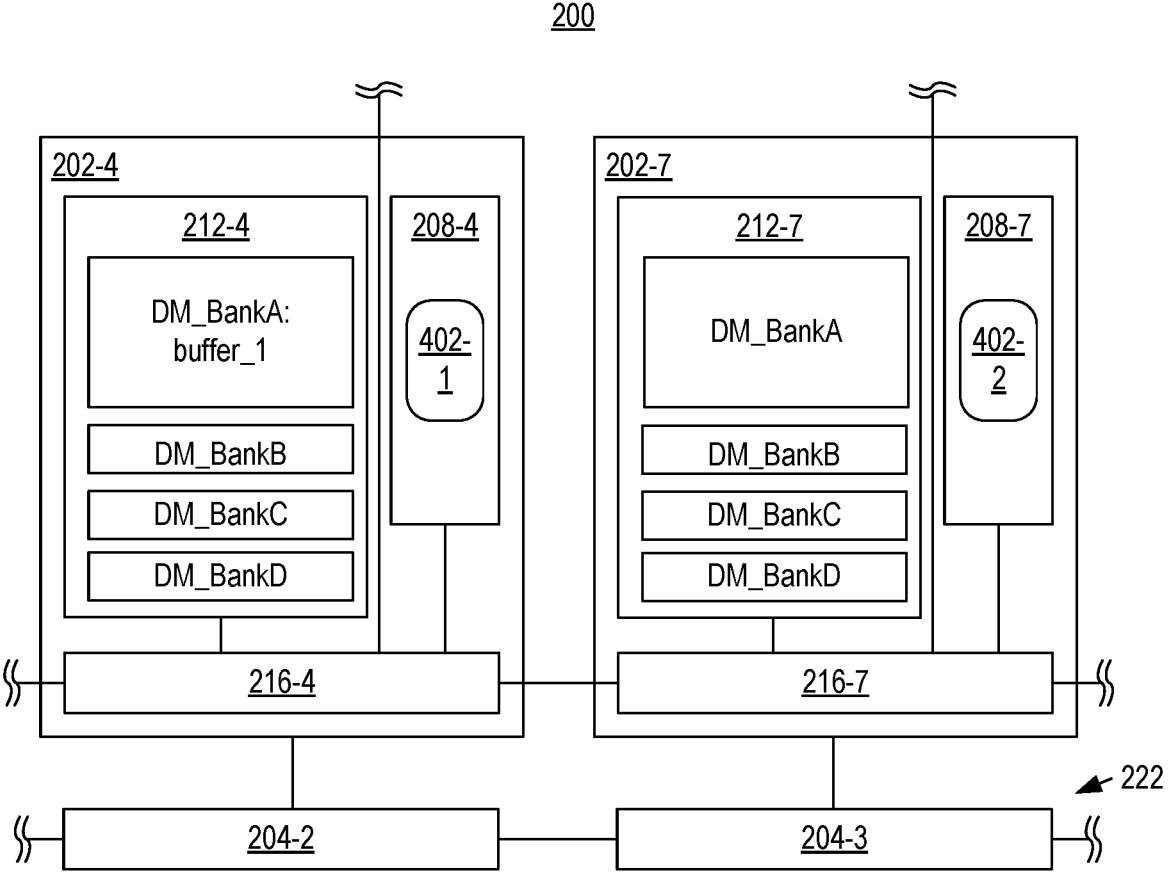
FIG. 4 illustrates a portion of a multicore circuit architecture with a portion of a design mapped thereto in accordance with generated buffer constraints.

FIG. 4 illustrates a portion of data processing array 200 with a portion of a design mapped thereto. In the example of FIG. 4, kernels 402-1 and 402-2 are different instances of a same kernel executed by compute tiles 202-4 and 202-7, respectively. In the example of FIG. 4, buffer_1 is independent. In this example, one copy of buffer_1 is included in DM_BankA of memory 212-4. Both kernels 402-1 and 402-2 access this single implementation of buffer_1 from memory 212-4.

Figure 5:
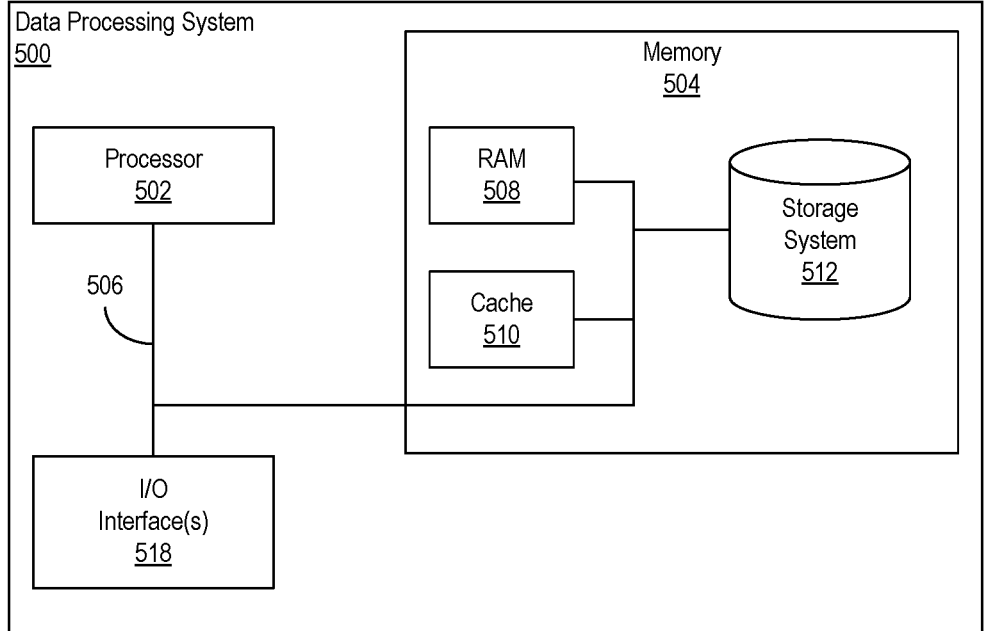
FIG. 5 illustrates an example implementation of a data processing system for use with the inventive arrangements.

FIG. 5 illustrates an example implementation of a data processing system 500. As defined herein, the term "data processing system" means one or more hardware systems configured to process data, each hardware system including at least one hardware processor and memory, wherein the hardware processor is programmed with computer-readable instructions that, upon execution, initiate operations. Data processing system 500 can include a processor 502 (e.g., a hardware processor), a memory 504, and a bus 506 that couples various system components including memory 504 to processor 502.

Processor 502 may be implemented as one or more processors. In an example, processor 502 is implemented as a central processing unit (CPU). Processor 502 may be implemented as one or more circuits capable of carrying out instructions contained in program code. The circuit may be an integrated circuit or embedded in an integrated circuit. Processor 502 may be implemented using a complex instruction set computer architecture (CISC), a reduced instruction set computer architecture (RISC), a vector processing architecture, or other known architectures. Example hardware processors include, but are not limited to, processors having an x86 type of architecture (IA-32, IA-64, etc.), Power Architecture, ARM processors, and the like.

Bus 506 represents one or more of any of a variety of communication bus structures. By way of example, and not limitation, bus 506 may be implemented as a Peripheral Component Interconnect Express (PCIe) bus. Data processing system 500 typically includes a variety of computer system readable media. Such media may include computer-readable volatile and non-volatile media and computer-readable removable and non-removable media.

Memory 504 can include computer-readable media in the form of volatile memory, such as random-access memory (RAM) 508 and/or cache memory 510. Data processing system 500 also can include other removable/non-removable, volatile/non-volatile computer storage media. By way of example, storage system 512 can be provided for reading from and writing to a non-removable, non-volatile magnetic and/or solid-state media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 506 by one or more data media interfaces. Memory 504 is an example of at least one computer program product.

Memory 504 is capable of storing computer-readable program instructions that are executable by processor 502 to perform the operations described within this disclosure. For example, the computer-readable program instructions can include an operating system, one or more application programs, other program code, and program data. The computer-readable program instructions may include a compiler, a mapper, and/or an EDA tool as described herein.

Processor 502, in executing the computer-readable program instructions, is capable of performing the various operations described herein that are attributable to a computer. It should be appreciated that data items used, generated, and/or operated upon by data processing system 500 are functional data structures that impart functionality when employed by data processing system 500. As defined within this disclosure, the term "data structure" means a physical implementation of a data model's organization of data within a physical memory. As such, a data structure is formed of specific electrical or magnetic structural elements in a memory. A data structure imposes physical organization on the data stored in the memory as used by an application program executed using a processor.

Data processing system 500 may include one or more Input/Output (I/O) interfaces 518 communicatively linked to bus 506. I/O interface(s) 518 allow data processing system 500 to communicate with one or more external devices and/or communicate over one or more networks such as a local area network (LAN), a wide area network (WAN), and/or a public network (e.g., the Internet). Examples of I/O interfaces 518 may include, but are not limited to, network cards, modems, network adapters, hardware controllers, etc. Examples of external devices also may include devices that allow a user to interact with data processing system 500 (e.g., a display, a keyboard, and/or a pointing device) and/or other devices such as accelerator card.

Data processing system 500 is only one example implementation. Data processing system 500 can be practiced as a standalone device (e.g., as a user computing device or a server, as a bare metal server), in a cluster (e.g., two or more interconnected computers), or in a distributed cloud computing environment (e.g., as a cloud computing node) where tasks are performed by remote processing devices that are linked through a communications network. In a distributed cloud computing environment, program modules may be located in both local and remote computer system storage media including memory storage devices.

The example of FIG. 5 is not intended to suggest any limitation as to the scope of use or functionality of example implementations described herein. Data processing system 500 is an example of computer hardware that is capable of performing the various operations described within this disclosure. In this regard, data processing system 500 may include fewer components than shown or additional components not illustrated in FIG. 5 depending upon the particular type of device and/or system that is implemented. The particular operating system and/or application(s) included may vary according to device and/or system type as may the types of I/O devices included. Further, one or more of the illustrative components may be incorporated into, or otherwise form a portion of, another component. For example, a processor may include at least some memory.

The terminology used herein is for the purpose of describing particular embodiments only and is not intended to be limiting. Notwithstanding, several definitions that apply throughout this document are expressly defined as follows.

As defined herein, the singular forms "a," "an," and "the" are intended to include the plural forms as well, unless the context clearly indicates otherwise.

As defined herein, the term "approximately" means nearly correct or exact, close in value or amount but not precise.

For example, the term "approximately" may mean that the recited characteristic, parameter, or value is within a predetermined amount of the exact characteristic, parameter, or value.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention.

As defined herein, the term "computer-readable storage medium" means a storage medium that contains or stores program instructions for use by or in connection with an instruction execution system, apparatus, or device. As defined herein, a "computer-readable storage medium" is not a transitory, propagating signal per se. The various forms of memory, as described herein, are examples of computer-readable storage media. A non-exhaustive list of examples of computer-readable storage media include an electronic storage device, a magnetic storage device, an optical storage device, an electromagnetic storage device, a semiconductor storage device, or any suitable combination of the foregoing. A non-exhaustive list of more specific examples of a computer-readable storage medium may include: a portable computer diskette, a hard disk, a RAM, a read-only memory (ROM), an erasable programmable read-only memory (EPROM or Flash memory), an electronically erasable programmable read-only memory (EEPROM), a static random-access memory (SRAM), a portable compact disc read-only memory (CD-ROM), a digital versatile disk (DVD), a memory stick, a floppy disk, or the like.

As defined herein, "data processing system" means one or more hardware systems configured to process data, each hardware system including at least one hardware processor programmed to initiate operations and memory.

As defined herein, "execute" and "run" comprise a series of actions or events performed by the hardware processor in accordance with one or more machine-readable instructions. "Running" and "executing," as defined herein refer to the active performing of actions or events by the hardware processor. The terms run, running, execute, and executing are used synonymously herein.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the terms "individual" and "user" each refer to a human being.

As defined herein, the term "hardware processor" means at least one hardware circuit. The hardware circuit may be configured to carry out instructions contained in program code. The hardware circuit may be an integrated circuit. Examples of a hardware processor include, but are not limited to, a central processing unit (CPU), an array processor, a vector processor, a digital signal processor (DSP), a field-programmable gate array (FPGA), a programmable logic array (PLA), an application specific integrated circuit (ASIC), programmable logic circuitry, and a controller.

As defined herein, the terms "one embodiment," "an embodiment," "in one or more embodiments," "in particular embodiments," or similar language mean that a particular feature, structure, or characteristic described in connection with the embodiment is included in at least one embodiment described within this disclosure. Thus, appearances of the aforementioned phrases and/or similar language throughout this disclosure may, but do not necessarily, all refer to the same embodiment.

As defined herein, the term "output" means storing in physical memory elements, e.g., devices, writing to display or other peripheral output device, sending or transmitting to another system, exporting, or the like.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc., may be used herein to describe various elements. These elements should not be limited by these terms, as these terms are only used to distinguish one element from another unless stated otherwise or the context clearly indicates otherwise.

A computer program product may include a computer-readable storage medium (or media) having computer-readable program instructions thereon for causing a processor to carry out aspects of the inventive arrangements described herein. Within this disclosure, the term "program code" is used interchangeably with the term "program instructions." Computer-readable program instructions described herein may be downloaded to respective computing/processing devices from a computer-readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object-oriented programming language and/or procedural programming languages. Computer-readable program instructions may include state-setting data. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer-readable program instructions by utilizing state information of the computer-readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer-readable program instructions, e.g., program code.

These computer-readable program instructions may be provided to a processor of a computer, special-purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the operations specified in the flowchart and/or block diagram block or blocks.

The computer-readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method, comprising:
converting, as part of a compilation process and using computer hardware, a design specified in a high-level programming language into an intermediate representation, wherein the design specifies a plurality of kernels for a multicore circuit architecture having a plurality of compute tiles;
detecting buffers of dataflows of the intermediate representation on a per kernel basis;
determining whether the buffers are independent or dependent based on an analysis of the dataflows of the intermediate representation performed using the computer hardware;
generating buffer constraints, wherein the buffer constraints specify whether the buffers of the intermediate representation are independent and provide guidance for mapping the buffers in the multicore circuit architecture; and
mapping, as part of the compilation process, the buffers to same compute tiles or to different compute tiles of the multicore circuit architecture based on independence or dependence of individual ones of the buffers specified by the buffer constraints and mapping the plurality of kernels to the plurality of compute tiles, wherein object code for the plurality of kernels and configuration data for the buffers are generated.

2. The method of claim 1, further comprising:
modifying the design, as specified in the high-level programming language, to specify memory banks for the buffers based on the buffer constraints.

3. The method of claim 1, wherein the buffers are mapped to a same compute tile of the multicore circuit architecture in response to determining that the buffers are dependent.

4. The method of claim 1, wherein the buffers are mapped to a same memory bank of a same compute tile of the multicore circuit architecture in response to determining that the buffers are dependent.

5. The method of claim 1, wherein the buffers are mapped to different compute tiles of the multicore circuit architecture in response to determining that the buffers are independent.

6. The method of claim 1, wherein the buffers are mapped to different memory banks of a same compute tile of the multicore circuit architecture in response to determining that the buffers are independent.

7. A system, comprising:
one or more hardware processors configured to initiate operations including:
converting, as part of a compilation process, a design specified in a high-level programming language into an intermediate representation, wherein the design specifies a plurality of kernels for a multicore circuit architecture having a plurality of compute tiles;
detecting buffers of dataflows of the intermediate representation on a per-kernel basis;
determining whether the buffers are independent or dependent based on an analysis of the dataflows of the intermediate representation;
generating buffer constraints, wherein the buffer constraints specify whether the buffers of the intermediate representation are independent and provide guidance for mapping the buffers in the multicore circuit architecture; and
mapping, as part of the compilation process, the buffers to same compute tiles or to different compute tiles of the multicore circuit architecture based on independence or dependence of individual ones of the buffers specified by the buffer constraints and mapping the plurality of kernels to the plurality of compute tiles, wherein object code for the plurality of kernels and configuration data for the buffers are generated.

8. The system of claim 7, wherein the one or more hardware processors are configured to initiate operations further comprising:
modifying the design, as specified in the high-level programming language, to specify memory banks for the buffers based on the buffer constraints.

9. The system of claim 7, wherein the buffers are mapped to a same compute tile of the multicore circuit architecture in response to determining that the buffers are dependent.

10. The system of claim 7, wherein the buffers are mapped to a same memory bank of a same compute tile of the multicore circuit architecture in response to determining that the buffers are dependent.

11. The system of claim 7, wherein the buffers are mapped to different compute tiles of the multicore circuit architecture in response to determining that the buffers are independent.

12. The system of claim 7, wherein the buffers are mapped to different memory banks of a same compute tile of the multicore circuit architecture in response to determining that the buffers are independent.

13. A computer program product comprising one or more computer readable storage mediums having program instructions embodied therewith, the program instructions executable by computer hardware to cause the computer hardware to initiate executable operations comprising:
converting, as part of a compilation process, a design specified in a high-level programming language into an intermediate representation, wherein the design specifies a plurality of kernels for a multicore circuit architecture having a plurality of compute tiles;
detecting buffers of dataflows of the intermediate representation on a per kernel basis;
determining whether the buffers are independent or dependent based on an analysis of the dataflows of the intermediate representation;
generating buffer constraints, wherein the buffer constraints specify whether the buffers of the intermediate representation are independent and provide guidance for mapping the buffers in the multicore circuit architecture; and
mapping, as part of the compilation process, the buffers to same compute tiles or to different compute tiles of the multicore circuit architecture based on independence or dependence of individual ones of the buffers specified by the buffer constraints and mapping the plurality of kernels to the plurality of compute tiles, wherein object code for the plurality of kernels and configuration data for the buffers are generated.

14. The computer program product of claim 13, wherein the program instructions are executable by the computer hardware to cause the computer hardware to initiate executable operations comprising:

modifying the design, as specified in the high-level programming language, to specify memory banks for the buffers based on the buffer constraints.

15. The computer program product of claim 13, wherein the buffers are mapped to a same compute tile of the multicore circuit architecture in response to determining that the buffers are dependent.

16. The computer program product of claim 13, wherein the buffers are mapped to a same memory bank of a same compute tile of the multicore circuit architecture in response to determining that the buffers are dependent.

17. The computer program product of claim 13, wherein the buffers are mapped to different compute tiles of the multicore circuit architecture in response to determining that the buffers are independent; or the buffers are mapped to different memory banks of a same compute tile of the multicore circuit architecture in response to determining that the buffers are independent.

* * * * *